US009622313B2

(12) United States Patent
Kimura

(10) Patent No.: US 9,622,313 B2
(45) Date of Patent: Apr. 11, 2017

(54) DRIVER CIRCUIT DEVICE

(71) Applicant: Kabushiki Kaisha Toshiba, Minato-ku, Tokyo (JP)

(72) Inventor: Takashi Kimura, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/066,192

(22) Filed: Mar. 10, 2016

(65) Prior Publication Data

US 2017/0071040 A1 Mar. 9, 2017

Related U.S. Application Data

(60) Provisional application No. 62/215,597, filed on Sep. 8, 2015.

(51) Int. Cl.

| | |
|---|---|
| ***H03K 3/02*** | (2006.01) |
| ***H03K 17/00*** | (2006.01) |
| ***H05B 33/08*** | (2006.01) |
| ***H03K 3/027*** | (2006.01) |
| ***H03K 5/131*** | (2014.01) |

(52) U.S. Cl.

CPC ......... *H05B 33/0845* (2013.01); *H03K 3/027* (2013.01); *H03K 5/131* (2013.01); *H03K 17/002* (2013.01); *H05B 33/0815* (2013.01)

(58) Field of Classification Search

CPC ......... H03K 19/0016; H03K 19/00323; H03K 19/20; G06F 1/08; G06F 1/324; G01R 29/26; G01R 31/3016; G01R 31/31727; H05B 33/0815; H05B 33/0845; H05B 3/027

See application file for complete search history.

(56) References Cited

U.S. PATENT DOCUMENTS

| | | | | |
|---|---|---|---|---|
| 5,723,875 A | 3/1998 | Abe et al. | | |
| 7,400,160 B2 * | 7/2008 | Hokoiwa | G01R 31/31727 | 324/750.3 |
| 7,855,607 B2 * | 12/2010 | Shimamoto | G01R 29/26 | 324/76.54 |
| 8,035,312 B2 * | 10/2011 | Bodano | H05B 33/0818 | 315/209 R |
| 8,081,146 B2 * | 12/2011 | Wang | H05B 33/0815 | 345/76 |
| 8,456,098 B2 * | 6/2013 | Peting | H05B 37/0245 | 315/185 R |

(Continued)

FOREIGN PATENT DOCUMENTS

| | | |
|---|---|---|
| JP | 2008-067349 A | 3/2008 |
| JP | 2013-026464 A | 2/2013 |

*Primary Examiner* — Vibol Tan

(74) *Attorney, Agent, or Firm* — White & Case LLP

(57) ABSTRACT

A driver circuit device according to an embodiment includes an input part receiving a first signal obtained by logical operation of a first control signal and a first clock signal. An oscillator outputs a counter signal having a shorter cycle than the first clock signal. A measuring part measures a cycle of the first signal using the counter signal. A control signal generator generates a second control signal based on the cycle of the first signal and a logic of the first signal. A clock generator generates a second clock signal based on the cycle of the first signal. An output part outputs the second control signal and the second clock signal from the clock generator.

20 Claims, 5 Drawing Sheets

(56) References Cited

U.S. PATENT DOCUMENTS

| | | | | |
|---|---|---|---|---|
| 8,456,106 | B2 * | 6/2013 | Mednik .............. | H05B 33/0818<br>315/209 R |
| 8,742,786 | B2 * | 6/2014 | Komura ......... | G01R 31/318533<br>324/762.01 |
| 9,183,786 | B2 * | 11/2015 | Yamada ............... | G09G 3/3406 |

* cited by examiner

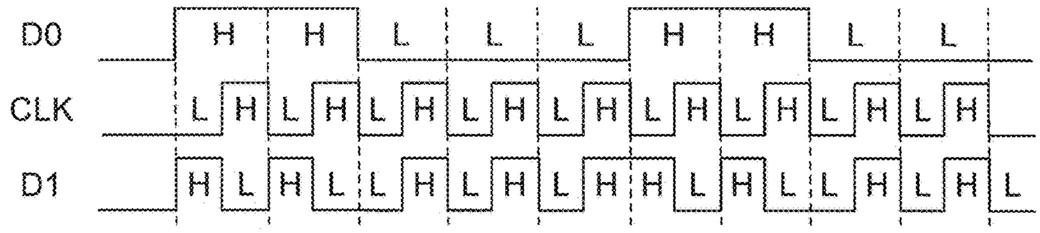
FIG. 3A
| D0 | CLK | D1 |
|---|---|---|
| L | L | L |
| L | H | H |
| H | L | H |
| H | H | L |
FIG. 3B
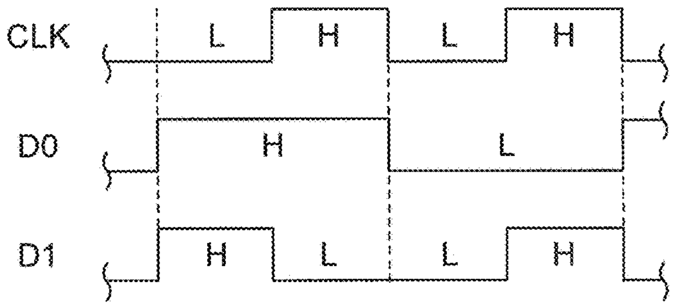
FIG. 3C

DRIVER CIRCUIT DEVICE

CROSS REFERENCE TO RELATED APPLICATIONS

This application is based upon and claims the benefit of priority from the prior U.S. Provisional Patent Application No. 62/215,597, filed on Sep. 8, 2015, the entire contents of which are incorporated herein by reference.

FIELD

The embodiments of the present invention relate to a driver circuit device.

BACKGROUND

An LED (Light Emitting Diode) used for illuminations, a backlight of a display device, or the like is controlled by a driver circuit device. A driver circuit device receives inputs of a control signal for controlling turning on/off and brightness of an LED and a clock signal for determining a control timing for the LED and controls the LED in synchronization with the clock signal and in accordance with the control signal.

However, a conventional driver circuit device requires two signal lines (harnesses) to transmit the control signal and the clock signal. When the two harnesses extend over a plurality of printed circuit boards, there is a problem that the number of the harnesses becomes large or the entire length of the harnesses becomes long.

BRIEF DESCRIPTION OF THE DRAWINGS

FIG. 3A is a timing chart showing an example of an operation of the XOR logic circuit 20;

FIG. 3B is a truth table of exclusive OR;

FIG. 3C shows a relation between the logic of the first control signal D0 and the logic of the first signal D1;

DETAILED DESCRIPTION

A driver circuit device according to an embodiment includes an input part receiving a first signal obtained by logical operation of a first control signal and a first clock signal. An oscillator outputs a counter signal having a shorter cycle than the first clock signal. A measuring part measures a cycle of the first signal using the counter signal. A control signal generator generates a second control signal based on the cycle of the first signal and a logic of the first signal. A clock generator generates a second clock signal based on the cycle of the first signal. An output part outputs the second control signal and the second clock signal from the clock generator.

Embodiments will now be explained with reference to the accompanying drawings. The present invention is not limited to the embodiments.

First Embodiment

Figure 1:
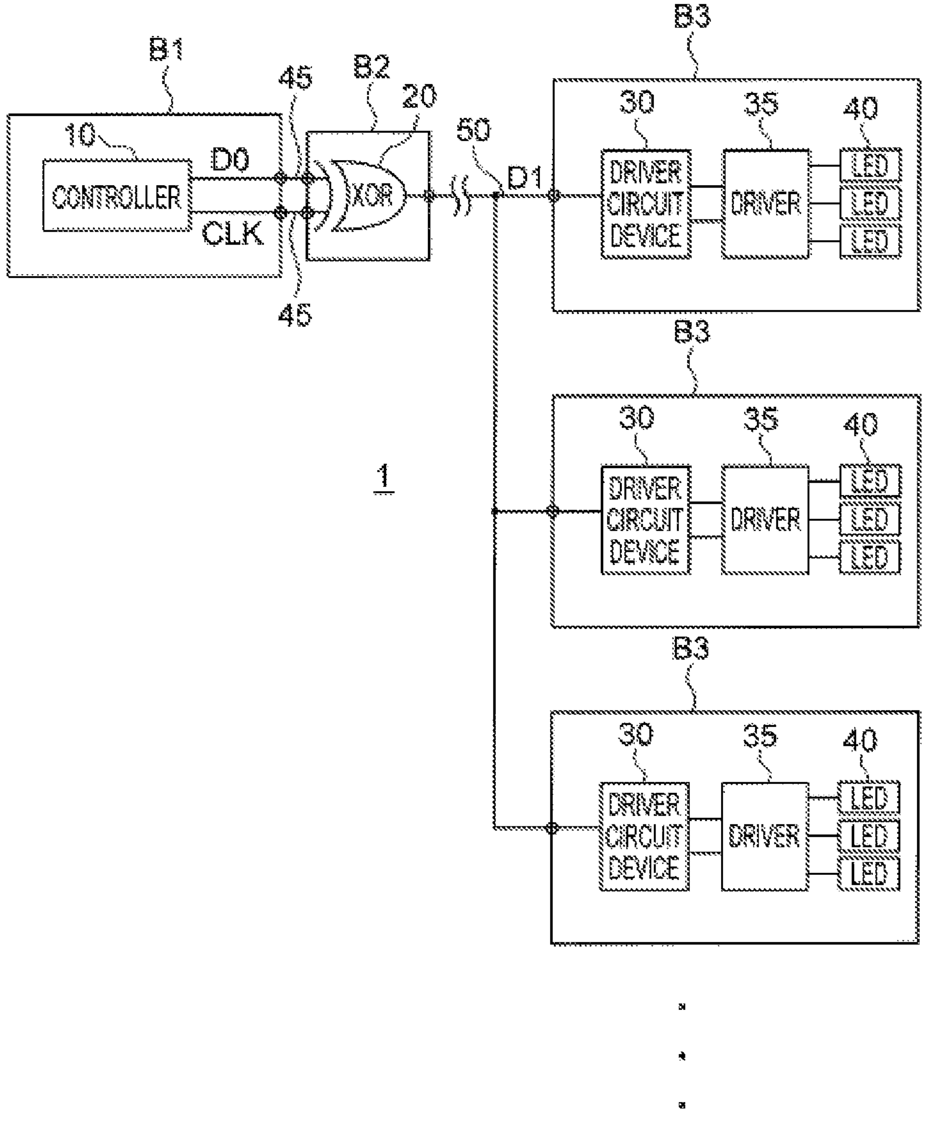
FIG. 1 is a block diagram showing an example of a configuration of an LED driving system 1 according to a first embodiment.

FIG. 1 is a block diagram showing an example of a configuration of an LED driving system 1 (hereinafter, also "system 1") according to a first embodiment.

The system 1 includes a controller 10, an XOR logic circuit 20, driver circuit devices 30, drivers 35, LEDs 40, and harnesses 45 and 50. Although not limited to a particular system, the system 1 is a driver circuit system used for illuminations or a backlight of a display device, for example.

The controller 10 outputs a first control signal D0 for controlling turning on/off or brightness of the LEDs 40 as loads and a first clock signal CLK indicating timings for operations of the LEDs 40. The controller 10 outputs the first control signal D0 In synchronization with the first clock signal CLK. For example, the controller 10 is a semiconductor chip such as an MCU (Micro Controller Unit) and is mounted on a printed circuit board B1 (hereinafter, "board B1").

The XOR logic circuit 20 receives inputs of the first control signal D0 and the first clock signal CLK and outputs exclusive OR of the first control signal D0 and the first clock signal CLK as a single first signal D1. For example, the XOR logic circuit 20 is formed as one semiconductor chip and mounted on a printed circuit board B2 (hereinafter, "board B2"). The XOR logic circuit 20 is provided on the board B2 that differs from the board B1 or a printed circuit board B3 (hereinafter, "board B3"). However, the XOR logic circuit 20 can alternatively be installed on either the board B1 or B3.

The driver circuit device (a first driver circuit device) 30 receives an input of the first signal D1, converts the first signal D1 to a second control signal D0 and a second clock signal CLK, and drives the LEDs 40 at a timing indicated by the second clock signal CLK based on the second control signal D0. The driver circuit device 30 is connected to the LEDs 40 via the driver 35. For example, the driver circuit device 30 is formed as a semiconductor chip and mounted on the board B3. The second control signal is a signal that is obtained by regenerating the first control signal. The second clock signal is a signal that is obtained by regenerating the first clock signal. Therefore, the second control signal is substantially the same as the first control signal and the second clock signal is substantially the same as the first clock signal. Accordingly, both the first and second control signals are denoted by a reference sign "D0" and both the first and second clock signals are denoted by a reference sign "CLK".

The driver (a second driver circuit device) 35 receives the second control signal D0 and the second clock signal CLK from the driver circuit device 30 and supplies power to the LEDs 40 in accordance with the second control signal D0 and the second clock signal CLK. The driver 35 can be a two-line input driver circuit that receives inputs of the second control signal D0 and the second clock signal CLK directly from the controller 10 and that drives the LEDs 40. For example, the driver 35 is mounted on the board B3 together with the driver circuit device 30.

The LEDs 40 emit light with power supplied from the driver circuit device 30. At that time, the LEDs 40 emit light with brightness according to the second control signal D0 and at a timing according to the second clock signal CLK. For example, three LEDs 40 respectively corresponding to three primary colors (R, G, and B) of light are provided for the driver circuit device 30. Accordingly, the LEDs 40 can output various colors with desired brightness. For example, the LEDs 40 are mounted on the board B3 together with the driver circuit device 30.

As shown in FIG. 1, a plurality of the boards B3 can share one controller 10 and one XOR logic circuit 20. In this case, the boards B3 are connected to the XOR logic circuit 20 in parallel. The first and second control signals D0 contain address information indicating which one of the driver circuit devices 30 is to be driven and channel information indicating which one of the three LEDs 40 connected to the driven driver circuit device 30 is to be driven.

Each of the driver circuit devices 30 of the boards B3 connected in parallel has unique address information (an identifier). To enable the driver circuit device 30 to drive arbitrary one of the LEDs 40 selectively, the driver circuit device 30 has pieces of channel information unique to the respective LEDs 40 connected to the driver circuit device 30. The address information and the channel information can be stored in a register (not shown) In the relevant driver circuit device 30 in advance.

The driver circuit devices 30 connected in parallel receive the same first signal D1. The driver circuit devices 30 operate in accordance with the second control signal D0 corresponding to the first signal D1 when the address information is identical with the own address. When the address information differs from the own address, the driver circuit devices 30 do not operate even when receiving the first signal D1. In this manner, the system 1 can operate arbitrary one of the driver circuit devices 30 selectively with one first control signal D0. The selected driver circuit device 30 can drive arbitrary one of the LEDs 40 selectively based on the channel information.

Although not shown, a two-line input driver circuit device that receives inputs of the first control signal D0 and the first clock signal CLK can alternatively be connected in parallel with the driver circuit devices 30 without the XOR logic circuit 20 interposed therebetween. In this case, it suffices that the two-line input driver circuit device receives the first control signal D0 and the first clock signal CLK from the controller 10 via two harnesses 50.

Figure 2:
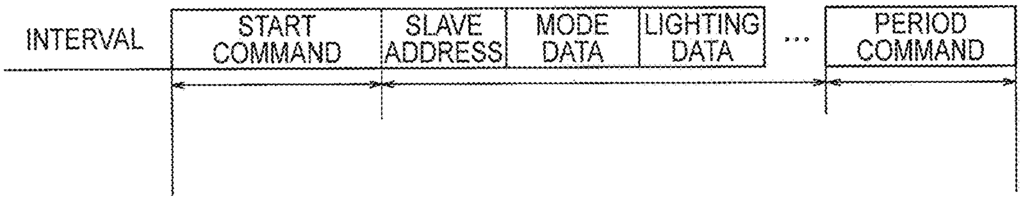
FIG. 2 shows a data format of the first and second control signals D0.

FIG. 2 shows a data format of the first and second control signals D0 (hereinafter, also simply "control signal D0"). The controller 10 outputs a plurality of the control signals D0 at intervals of a predetermined time period or longer. For example, the time period of the Interval is set to 10 microseconds or longer.

The control signal D0 includes a start command, a slave address, mode data, lighting data, and a period command.

The start command is data Indicating start of the control signal D0 and has a predetermined data pattern. For example, start command has a data pattern of "11111111". When receiving the first signal D1 corresponding to the start command, the driver circuit device 30 recognizes start of the control signal D0. In the first embodiment, the driver circuit device 30 uses the start command to detect the cycle or phase of the data of the first signal D1.

The slave address contains the address information and the channel information. As described above, the address information is used to specify the driver circuit devices 30. The channel information is used to specify one of the three LEDs 40 connected to the specified driver circuit device 30.

The mode data is data for setting an output mode of the driver circuit device 30 and the driver 35. When an output mode is set, a light-emitting pattern of the specified LED 40 is set. The light-emitting pattern is repeated until the next control signal D0.

The lighting data is a data pattern indicating specific operations of the LED 40 including turning on/off, the brightness, and the like. The driver circuit device 30 and the driver 35 supply power to the LED 40 in accordance with the lighting data to operate the LED 40.

The period command is data indicating end of the control signal D0 and has a predetermined data pattern. For example, the period command has a data pattern of "10000001". When receiving the first signal D1 corresponding to the period command, the driver circuit device 30 recognizes end of the control signal D0. In the first embodiment, the driver circuit device 30 is used to reset the cycle or phase of data of the first signal D1 detected by the start command. The next control signal D0 is output after the elapse of the interval.

The control signal D0 described above as well as the first clock signal CLK are output from the controller 10. The XOR logic circuit 20 outputs exclusive OR of the control signal D0 and the first clock signal CLK as the single first signal D1. The first signal D1 is transmitted to the driver circuit devices 30 via the harness 50. The driver circuit devices 30 regenerate the control signal D0 and the first clock signal CLK from the first signal D1. The drivers 35 drive the LEDs 40 based on the regenerated control signal D0 and the regenerated first clock signal CLK.

In this manner, in the first embodiment, the control signal D0 and the first clock signal CLK from the controller 10 are converted to the single first signal D1 and the converted first signal D1 is transmitted to the driver circuit devices 30 via the harness 50. Accordingly, plural harnesses 50 for transmitting the control signal D0 and the first clock signal CLK respectively are not required for each of the driver circuit devices 30. It suffices that one harness 50 for transmitting the single first signal D1 is provided for each of the driver circuit devices 30.

FIG. 3A is a timing chart showing an example of an operation of the XOR logic circuit 20. FIG. 3B is a truth table of exclusive OR.

The XOR logic circuit 20 receives inputs of the first control signal D0 and the first clock signal CLK and outputs exclusive OR of the first control signal D0 and the first clock signal CLK as the first signal D1. For example, the first control signal D0 has data of a logical High (hereinafter, also "H" or "1") or a logical Low (hereinafter, also "L" or "0") for each cycle of the first clock signal CLK. The XOR logic circuit 20 outputs the first signal D1 shown in FIG. 3A as the exclusive OR of the first control signal D0 and the first clock signal CLK. In this manner, the XOR logic circuit 20 outputs the first signal D1 in accordance with the truth table shown in FIG. 3B. Accordingly, the XOR logic circuit 20 can convert the first control signal D0 and the first clock signal CLK to the first signal D1 and transmit the first signal D1 via one harness 50.

FIG. 3C shows a relation between the logic of the first control signal D0 and the logic of the first signal D1. It is assumed here that the cycle of the first clock signal CLK is constituted by a combination of one logical Low (L) and one logical High (H) subsequent thereto. That is, it is assumed that one cycle of the first clock signal CLK is "LH" as shown in FIGS. 3A and 3C. In this case, a logical High (H) of the first control signal D0 is converted to "HL" as the first signal D1. A logical Low (L) of the first control signal D0 is converted to "LH" as the first signal D1. Consequently, when the first signal D1 is "HL" in the cycle of the first clock signal CLK, the driver circuit device 30 can determine that the first control signal D0 is a logical High. When the first signal D1 is "LH", the driver circuit device 30 can determine that the first control signal D0 is a logical Low. That is, when the driver circuit device 30 receives an input of the first signal D1 and can detect the cycle of the first clock signal CLK, the driver circuit device 30 can regenerate the first control signal D0 from the first signal D1. In this example, the regenerated first control signal D0 is the second control signal D0. The regenerated first clock signal CLK is the second clock signal CLK.

To generate the second control signal D0 and the second clock signal CLK from the first signal D1, the driver circuit device 30 has the following configuration.

Figure 4:
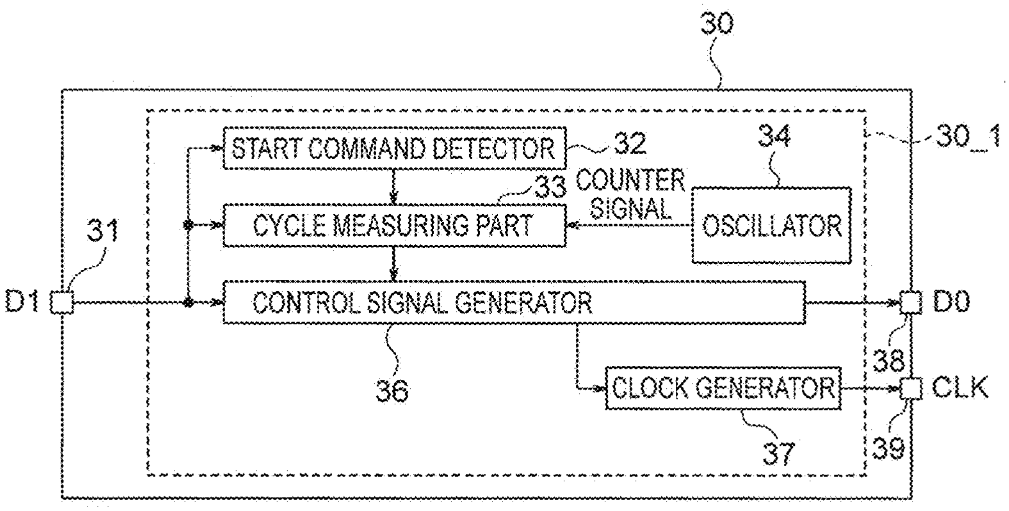
FIG. 4 is a block diagram showing an example of an internal configuration of the driver circuit device 30 according to the first embodiment.

FIG. 4 is a block diagram showing an example of an internal configuration of the driver circuit device 30 according to the first embodiment. The driver circuit device 30 includes an Input part 31, a start command detector 32, a cycle measuring part 33, an oscillator 34, a control signal generator 36, a clock generator 37, and output parts 38 and 39. The start command detector 32, the cycle measuring part 33, the oscillator 34, the control signal generator 36, and the clock generator 37 constitute a signal regenerator 30_1 that generates the second control signal D0 and the second clock signal CLK from the first signal D1.

The input part 31 receives an input of the first signal D1. The input part 31 is connected to the start command detector 32, the cycle measuring part 33, and the control signal generator 36. The input part 31 transmits the input first signal D1 to the start command detector 32, the cycle measuring part 33, and the control signal generator 36.

The start command detector 32 detects a start command. As described above, the start command has a predetermined data pattern. Accordingly, when the predetermined data pattern is input after an Interval, the start command detector 32 detects an input of the first signal D1 corresponding to the first control signal D0.

The cycle measuring part 33 receives a counter signal from the oscillator 34 and measures a cycle T of the first signal D1 using the counter signal. The oscillator 34 generates a counter signal of a predetermined cycle shorter than the cycle of the first clock signal CLK and outputs the counter signal to the cycle measuring part 33. To enable the cycle of the first signal D1 (the first clock signal CLK) to be measured precisely, the counter signal preferably has a frequency approximately ten or more times as high as that of the first signal D1 (the first clock signal CLK). That is, to enable the cycle of the first clock signal CLK to be measured precisely, the cycle of the counter signal is preferably approximately one-tenth or less of the cycle of the first clock signal CLK.

Figure 5:
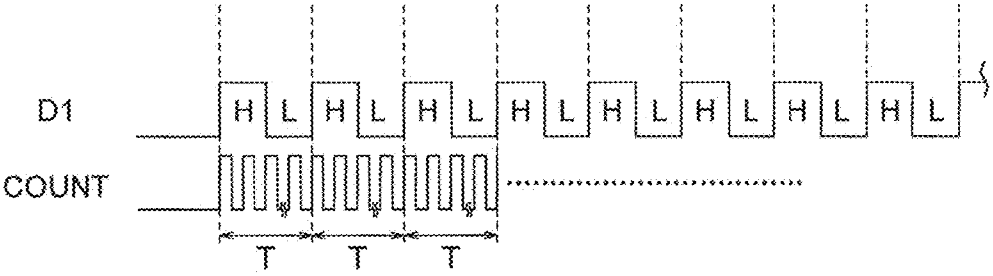
FIG. 5 is a timing chart showing a cycle measuring operation of the cycle measuring part 33.

The start command is also used in the cycle measuring part 33 to measure the cycle of the first signal D1. For example, FIG. 5 is a timing chart showing a cycle measuring operation of the cycle measuring part 33. When the start command is "11111111" as described above, it is known in advance that the first signal D1 corresponding to the start command is "1010101010101010 (HLHLHLHLHLHLHLHL)" as shown in FIG. 5. Accordingly, the cycle measuring part 33 measures a time period (a cycle) T of a data pattern "10 (HL)" in the start command of the first signal D1 using the numbers of counter signals COUNT. For example, because the first data pattern "10 (HL)" of the first signal D1 corresponds to the first "1" in the start command, the time period T is the cycle of the first clock signal CLK. The subsequent other data patterns "10 (HL)" in the first signal D1 also correspond to respective "1" in the start command of the first clock signal CLK. Accordingly, the respective time periods T of other data patterns "10 (HL)" are also the cycle of the first clock signal CLK.

For example, when the frequency of the first clock signal CLK is 2 MHz and the frequency of the counter signal COUNT is 20 MHz, the data pattern "10" of the first signal D1 corresponds to ten counts of the counter signal COUNT. Consequently, it is known that one cycle (the time period T) of the first clock signal CLK is 0.5 microsecond, which is a time period for ten counts of the counter signal COUNT.

In this manner, the cycle measuring part 33 can measure the cycle of the first clock signal CLK using the data pattern of the first signal D1 corresponding to the start command and the counter signal COUNT.

In the above example, the start command contains eight data patterns "10" of the first signal D1. Accordingly, the cycle measuring part 33 can alternatively measure a plurality of the time periods T using a plurality of the data patterns "10" of the first signal D1 and average the time periods T to calculate the cycle of the first clock signal CLK. Hereinafter, the time period T is also referred to as a cycle T of the first or second signal D1 or a cycle T of the first or second clock signal CLK.

The control signal generator 36 converts "10 (HL)" in the first signal D1 to "1 (H)" in the second control signal D0 and converts "01 (LH)" in the first signal D1 to "0 (L)" in the second control signal D0 based on the cycle T of the first signal D1 measured by the cycle measuring part 33 and the logic of the first signal D1. That is, when the first signal D1 changes from a first logic (for example, "H") to a second logic (for example, "L") in the cycle T of the first signal D1, the control signal generator 36 determines that the first control signal D0 is a first logic (for example, "H"). On the other hand, when the first signal D1 changes from a second logic (for example, "L") to a first logic (for example, "H") in the cycle T of the first signal D1, the control signal generator 36 determines that the first control signal D0 is a second logic (for example, "L"). The control signal generator 36 can thereby regenerate the first control signal D0 including a slave address, mode data, lighting data, a period command, and the like following the start command. The control signal generator 36 outputs the regenerated first control signal D0 as the second control signal D0 from the output part 38. Consequently, the second control signal D0 is substantially the same as the first control signal D0. The names of the data logics (logical High and logical Low, "1" and "0", or "H" and "L") are set for convenience. The names can be interchanged with each other.

The clock generator 37 generates the second clock signal CLK using the cycle T of the first signal D1 measured by the cycle measuring part 33. For example, as shown in FIG. 3C, one cycle of the first clock signal CLK output by the controller 10 is "LH". The data pattern of one cycle of the first clock signal CLK is known in advance. Accordingly, the clock generator 37 determines the first half cycle and the last half cycle of the time period T as "L" and "H", respectively, so that the clock generator 37 can regenerate one cycle "LH" of the first clock signal CLK. In this manner, the clock generator 37 can regenerate the first clock signal CLK synchronized with the first control signal D0, similarly to the first clock signal CLK output from the controller 10. That is, the clock generator 37 can regenerate the first clock signal CLK based on the cycle T of the first signal D1. The clock generator 37 outputs the generated first clock signal CLK as the second clock signal CLK from the output part 39.

Consequently, the second clock signal CLK is substantially the same as the first clock signal CLK.

The output parts 38 and 39 output the second control signal D0 from the control signal generator 36 and the second clock signal CLK from the clock generator 37, respectively. The output parts 38 and 39 are connected to the LEDs 40 via the driver 35. In this manner, the system 1 can turn on or off the LEDs 40 as light emitting elements or change the brightness of the LEDs 40 according to the second control signal D0 from the control signal generator 36 and the second clock signal CLK from the clock generator 37.

Thereafter, when the driver circuit device 30 receives a period command and processing of one first signal D1 is ended, the driver circuit device 30 resets the cycle of the first signal D1 (the control signal D0).

As described above, in the first embodiment, the first control signal D0 and the first clock signal CLK from the controller 10 are converted to the single first signal D1, and the first signal D1 is transmitted to each of the driver circuit devices 30 via one harness 50. The driver circuit device 30 generates the second control signal D0 and the second clock signal CLK (regenerates the first control signal D0 and the first clock signal CLK) using the first signal D1 and the internal counter signal to drive the LEDs 40. Therefore, one harness 50 suffices for each of the driver circuit devices 30 to transmit the single first signal D1.

The harness 50 is a wire connecting the boards B1 to B3 electrically. The length of the harness 50 and the number of the harnesses 50 are preferably minimized. For example, two harnesses 45 are provided between the boards B1 and B2 in FIG. 1. However, when the distance between the boards B1 and B2 is shortened, the entire length of the harnesses 45 can be shortened. Accordingly, although the number of the harnesses 45 between the boards B1 and B2 is two, this is not a great disadvantage. On the other hand, the harness 50 between the boards B2 and B3 is relatively long and provided for each of the boards B3. Accordingly, if two harnesses 50 are provided for each of the boards B3, the entire wire length (the entire wire amount) of the harnesses 50 becomes considerably long (large). That is, if the driver circuit device 30 is a two-line driver circuit device that receives inputs of the first control signal D0 and the first clock signal CLK separately, two relatively-long harnesses 50 are required for each of the boards B3 and the entire wire length (the entire wire amount) of the harnesses 50 becomes considerably long (large). This causes an increase in cost of the system 1.

On the other hand, in the system 1 according to the first embodiment, one relatively-long harness 50 between the boards B2 and B3 suffices. Furthermore, one harness 50 is sufficient for each of the boards B3. Therefore, in the system 1 according to the first embodiment, the number of the relatively-long harnesses 50 between the boards B2 and B3 can be reduced and the entire wire length (the entire wire amount) of the harness 50 can be relatively shortened (reduced). Because the harnesses 50 between the boards B2 and B3 can be reduced in the number and thus can be simplified, the entire size of the system 1 can be reduced.

Second Embodiment

Figure 6:
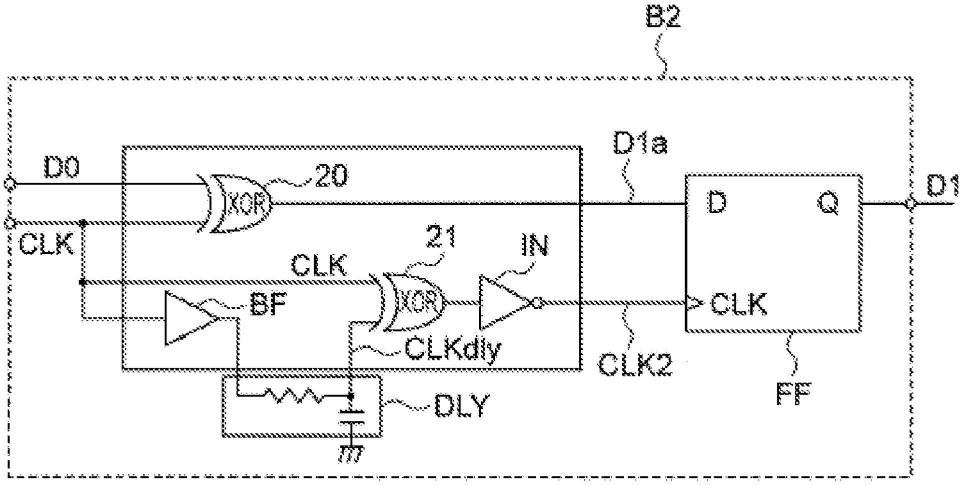
FIG. 6 is a block diagram showing a configuration of the board B2 including the XOR logic circuit 20 of the driver circuit system 1 according to a second embodiment.

FIG. 6 is a block diagram showing a configuration of the board B2 including the XOR logic circuit 20 of the driver circuit system 1 according to a second embodiment. Constituent elements identical to those in the first embodiment are denoted by like reference characters and explanations thereof will be omitted.

In some cases, the first control signal D0 from the controller 10 is input to the XOR logic circuit 20 via a load such as a buffer or a waveform shaper (not shown). In these cases, the first control signal D0 may be delayed from the first clock signal CLK. When the first control signal D0 is delayed from the first clock signal CLK, a phase difference is caused between the first control signal D0 and the first clock signal CLK. In this case, in the system 1 according to the first embodiment, noises occur in the first signal D1 output from the XOR logic circuit 20.

In the second embodiment, an XOR logic circuit 21 and a delay circuit DLY shown in FIG. 6 are additionally provided to eliminate such noises.

In the second embodiment, the board B2 includes the XOR logic circuit 20, the XOR logic circuit 21, a buffer BF, an inverter IN, the delay circuit DLY, and a flip-flop FF. In the second embodiment, the XOR logic circuit 20, the XOR logic circuit 21, the buffer BF, and the inverter IN constitute one semiconductor chip separately from the semiconductor chips of the driver circuit devices 30. Each of the delay circuit DLY and the flip-flop FF also constitutes one semiconductor chip separately from the semiconductor chips of the driver circuit devices 30. These semiconductor chips are mounted on the board B2. Designs of the semiconductor chips and the board B2 can be modified arbitrarily. Therefore, all functions mounted on the board B2 may be constituted by one semiconductor chip. Alternatively, the functions mounted on the board B2 can be constituted by a plurality of semiconductor chips in arbitrary units.

The XOR logic circuit 20 as a first calculator receives inputs of the first control signal D0 and the first clock signal CLK and outputs exclusive OR of the first control signal D0 and the first clock signal CLK as a first signal D1*a* similarly to that in the first embodiment.

For example, the delay circuit DLY is an RC delay circuit. The delay circuit DLY receives an input of the first clock signal CLK via the buffer BF and outputs a delay clock signal CLKdly that is a signal obtained by delaying the first clock signal CLK for a predetermine time to the XOR logic circuit 21.

The XOR logic circuit 21 as a second calculator receives inputs of the first clock signal CLK and the delay clock signal CLKdly to output an inverted signal of exclusive OR of the first clock signal CLK and the delay clock signal CLKdly as a third clock signal CLK2.

The flip-flop FF as a holding part receives inputs of the first signal D1*a* from the XOR logic circuit 20 and the third clock signal CLK2 from the XOR logic circuit 21. When the third clock signal CLK2 is activated to a logical High, the flip-flop FF effectively outputs a logic of the first signal D1*a* as it is. In this case, a logic of an output Q is a logic according to the logic of the first signal D1*a*. On the other hand, when the third clock signal CLK2 is deactivated to a logical Low, the flip-flop FF outputs the first signal D1*a* while maintaining the logic thereof at that time point. That is, even if the logic of the first signal D1*a* changes in a time period when the third clock signal CLK2 is deactivated to a logical Low, the flip-flop FF does not effectively output the first signal D1*a* and does not change the logic of the output Q. In this manner, the flip-flop FF holds (latches) the logic of the first signal D1*a* for a time period based on the logic of the third clock signal CLK2.

Figure 7:
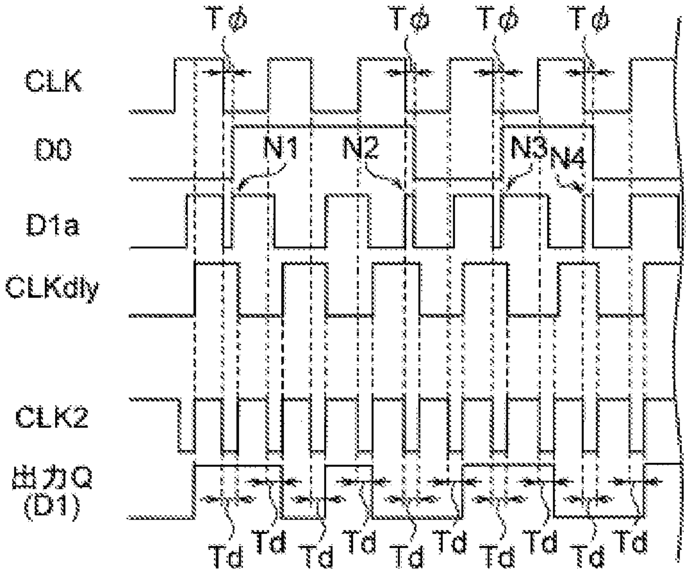
FIG. 7 is a timing chart showing an example of an operation of the diver circuit system 1 according to the second embodiment.

FIG. 7 is a timing chart showing an example of an operation of the diver circuit system 1 according to the second embodiment. The first control signal D0 and the first clock signal CLK are input to the XOR logic circuit 20.

The first control signal D0 and the first clock signal CLK are shifted in the phase from each other in some cases while being transmitted through the two harnesses 45 from the controller 10 to the XOR logic circuit 20. For example, as shown in FIG. 7, when the first control signal D0 is delayed from the first clock signal CLK, the first signal D1*a* output from the XOR logic circuit 20 may contain noises N1 to N4 caused by a phase difference between the first control signal D0 and the first clock signal CLK. Generation time periods of the noises N1 to N4 are a time period TΦ corresponding to the phase difference.

When the first control signal D0 is delayed from the first clock signal CLK in this way, each of the noises N1 to N4 is caused from a falling time point of the first clock signal CLK to a logic-inversion time point of the first control signal D0. That is, after the falling time points (falling edges) of the first clock signal CLK, the noises N1 to N4 are caused.

Meanwhile, the delay clock signal CLKdly is a signal obtained by delaying the first clock signal CLK for a predetermined delay time Td. The third clock signal CLK2 is an inverted signal of the exclusive OR of the first clock signal CLK and the delay clock signal CLKdly. Therefore, as shown in FIG. 7, the third clock signal CLK2 is a signal that is deactivated to a logical Low during the delay time Td after the falling time point (the falling edge) of the first clock signal CLK. As described above, when the third clock signal CLK2 is deactivated to a logical Low, the flip-flop FF latches the output Q. Consequently, the flip-flop FF latches the output Q during the delay time Td from the falling time point of the first clock signal CLK. When the noises N1 to N4 are caused during the respective delay times Td from the falling time points of the first clock signal CLK, the flip-flop FF can ignore (invalidate) logic changes in the first signal D1*a* accompanied with the noises N1 to N4 and can hold the output Q by latching the output Q. Consequently, as shown in FIG. 7, the noises N1 to N4 are eliminated from the first signal D1*a* and the first signal D1 not containing any of the noises N1 to N4 can be output from the output Q. When the delay time Td is shorter than the generation time period TΦ of the noises N1 to N4, parts of the noises N1 to N4 remain in the first signal D1. For this reason, the delay time Td is preferably equal to or longer than the generation time period To of the noises N1 to N4.

As described above, in the system 1 according to the second embodiment, the flip-flop FF holds (latches) the logic of the first signal D1*a* from the XOR logic circuit 20 for the time period Td based on the third clock signal CLK2 from the XOR logic circuit 21. The delay time Td is set longer than the noise generation time period To corresponding to a phase difference between the first control signal D0 and the first clock signal CLK. Consequently, it is possible to eliminate noises that are caused when the first control signal D0 and the first clock signal CLK are converted to a single first signal D1. As a result, malfunctions of the LEDs 40 can be suppressed. Furthermore, in the second embodiment, the number of the harnesses 50 can be reduced similarly in the first embodiment.

In the first and second embodiments, the controller 10 outputs the first control signal D0 and the first clock signal CLK separately. Therefore, the controller 10 can also control a two-line input driver circuit system that receives the first control signal D0 and the first clock signal CLK through two harnesses. For this reason, the driver circuit system 1 according to the above embodiments can be combined with a two-line input driver circuit system. Accordingly, a conventional system can be used as it is with the driver circuit system 1 according to the above embodiments added thereto.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A driver circuit device comprising:
 an input part receiving a first signal obtained by logical operation of a first control signal and a first clock signal;
 an oscillator outputting a counter signal having a shorter cycle than the first clock signal;
 a measuring part measuring a cycle of the first signal using the counter signal;
 a control signal generator generating a second control signal based on the cycle of the first signal and a logic of the first signal;
 a clock generator generating a second clock signal based on the cycle of the first signal; and
 an output part outputting the second control signal and the second clock signal.

2. The driver circuit device of claim 1, wherein
 the input part receives exclusive OR of the first control signal and the first clock signal as the first signal, and
 the control signal generator generates the second control signal which has a first logic when the first signal changes from a first logic to a second logic in one cycle of the first signal and has a second logic when the first signal changes from the second logic to the first logic in one cycle of the first signal.

3. The driver circuit device of claim 1, wherein
 the input part receives exclusive OR of the first control signal and the first clock signal as the first signal, and
 the control signal generator generates the second control signal which has a second logic when the first signal changes from a first logic to a second logic in one cycle of the first signal and has a first logic when the first signal changes from the second logic to the first logic in one cycle of the first signal.

4. The driver circuit device of claim 1, wherein the measuring part measures the cycle of the first signal using the first signal having a predetermined data pattern.

5. The driver circuit device of claim 1, wherein a light emitting element is turned on or off, or brightness of the light emitting element is changed in accordance with the second control signal from the control signal generator and the second clock signal from the clock signal generator.

6. The driver circuit device of claim 1, wherein the second control signal is a signal obtained by regenerating the first control signal.

7. The driver circuit device of claim 1, wherein the second clock signal is a signal obtained by regenerating the first clock signal.

8. A driving system comprising:
 a first calculator receiving inputs of a first control signal and a first clock signal and outputting a result of logical calculation of the first control signal and the first clock signal as a first signal;

a delay circuit delaying the first clock signal to output a delay clock signal;

a second calculator receiving inputs of the first clock signal and the delay clock signal and outputting a result of logical calculation of the first clock signal and the delay clock signal as a third clock signal;

a holding part holding a logic of the first signal based on the third clock signal; and a first driver circuit device comprising an input part receiving an input of the first signal, a signal regenerator generating a second control signal and a second clock signal from the first signal, and an output part outputting the second control signal and the second clock signal.

9. The driving system of claim 8, wherein the second control signal is a signal obtained by regenerating the first control signal.

10. The driving system of claim 8, wherein the second clock signal is a signal obtained by regenerating the first clock signal.

11. The driving system of claim 8, wherein the signal regenerator includes:

an oscillator outputting a counter signal having a shorter cycle than the first clock signal;

a measuring part measuring a cycle of the first signal using the counter signal;

a control signal generator generating a second control signal based on the cycle of the first signal and a logic of the first signal; and a clock generator generating a second clock signal based on the cycle of the first signal.

12. The driving system of claim 11, wherein the input part receives an exclusive OR of the first control signal and the first clock signal as the first signal, and the control signal generator generates the second control signal which has a first logic when the first signal changes from a first logic to a second logic in one cycle of the first signal and has a second logic when the first signal changes from the second logic to the first logic in one cycle of the first signal.

13. The driving system of claim 11, wherein the input part receives an exclusive OR of the first control signal and the first clock signal as the first signal, and the control signal generator generates the second control signal which has a second logic when the first signal changes from a first logic to a second logic in one cycle of the first signal and has a first logic when the first signal changes from the second logic to the first logic in one cycle of the first signal.

14. The driving system of claim 11, wherein the measuring part measures the cycle of the first signal using the first signal having a predetermined data pattern.

15. The driving system of claim 8, wherein the first calculator outputs exclusive OR of the first control signal and the first clock signal as the first signal, and the second calculator outputs a signal corresponding to exclusive OR of the first clock signal and the delay clock signal as the third clock signal.

16. The driving system of claim 8, wherein the first calculator and the second calculator perform same logical calculation.

17. The driving system of claim 8, wherein the first calculator, the delay circuit, the second calculator, and the holding part are located on a different chip or printed board from a chip or printed circuit board that the first driver circuit device is located on.

18. The driving system of claim 8, wherein a delay time of the delay clock signal from the first clock signal is equal to or longer than a delay time of the first control signal from the first clock signal.

19. The driving system of claim 8, further comprising a second driver circuit device driving a load upon receipt of the second control signal from the control signal generator and the second clock signal from the clock generator.

20. The driving system of claim 19, wherein the load is a light emitting element, and the second driver circuit device receives the second control signal and the second clock signal and turns on or off the light emitting element, or changes brightness of the light emitting element, based on the second clock signal and in accordance with the second control signal.

* * * * *